US008872348B2

(12) United States Patent
Yoo

(10) Patent No.: US 8,872,348 B2
(45) Date of Patent: Oct. 28, 2014

(54) STACK TYPE SEMICONDUCTOR DEVICE

(75) Inventor: Sun Jong Yoo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/601,097

(22) Filed: Aug. 31, 2012

(65) Prior Publication Data

US 2013/0277857 A1 Oct. 24, 2013

(30) Foreign Application Priority Data

Apr. 18, 2012 (KR) ........................ 10-2012-0040379

(51) Int. Cl.
*H01L 23/48* (2006.01)
*H01L 21/66* (2006.01)

(52) U.S. Cl.
USPC ............ 257/774; 257/E21.529; 257/E21.531; 257/773; 257/40; 257/48; 257/347

(58) Field of Classification Search
CPC ... H01L 23/48; H01L 25/0657; H01L 23/481; H01L 21/66; H01L 22/14; H01L 21/76898; H01L 22/34
USPC .......... 257/774, 773, 701, 700, 758, E23.011, 257/E21.597, 40, 48, 347, E21.529, 257/E21.531; 438/14, 17
See application file for complete search history.

(56) References Cited

U.S. PATENT DOCUMENTS

| 6,365,932 | B1 * | 4/2002 | Kouno et al. ................. 257/341 |
| 7,189,602 | B2 * | 3/2007 | Jiang et al. .................... 438/142 |
| 7,718,538 | B2 * | 5/2010 | Kim et al. ..................... 438/714 |
| 7,906,354 | B1 * | 3/2011 | Ellinger et al. ................. 438/26 |
| 8,008,748 | B2 * | 8/2011 | Collins et al. ................. 257/600 |
| 8,222,689 | B2 * | 7/2012 | Tu ................................. 257/329 |
| 8,273,640 | B2 * | 9/2012 | Ellinger et al. ............... 438/478 |
| 8,274,068 | B2 * | 9/2012 | Nagashima ...................... 257/5 |
| 8,373,208 | B2 * | 2/2013 | Bobde et al. .................. 257/262 |
| 2004/0159888 | A1 * | 8/2004 | Kobayashi et al. ........... 257/347 |
| 2006/0001047 | A1 * | 1/2006 | Chun et al. .................... 257/202 |
| 2007/0001928 | A1 * | 1/2007 | Jeong et al. ..................... 345/33 |
| 2010/0155897 | A1 * | 6/2010 | Collins et al. ................. 257/600 |
| 2010/0159657 | A1 * | 6/2010 | Arai et al. ..................... 438/268 |
| 2010/0178769 | A1 * | 7/2010 | Sadjadi et al. ................ 438/694 |
| 2011/0175142 | A1 * | 7/2011 | Tsurumi et al. ............... 257/192 |
| 2011/0240099 | A1 * | 10/2011 | Ellinger et al. ............... 136/250 |
| 2011/0240953 | A1 * | 10/2011 | Ellinger et al. ................... 257/9 |
| 2011/0248263 | A1 | 10/2011 | Augur |
| 2013/0082260 | A1 * | 4/2013 | Nakamura ....................... 257/48 |
| 2013/0168832 | A1 * | 7/2013 | Endo ............................. 257/621 |
| 2013/0214265 | A1 * | 8/2013 | Goto ............................... 257/40 |
| 2014/0159806 | A1 * | 6/2014 | Kim et al. ..................... 327/537 |

* cited by examiner

*Primary Examiner* — Alexander Oscar Williams
(74) *Attorney, Agent, or Firm* — William Park & Associates Patent Ltd.

(57) ABSTRACT

A stack type semiconductor device may include a first type well formed at a first height from a bottom of a semiconductor substrate; second type doping regions formed within the first type well at bottoms of regions where vias are expected to be formed; and a first type doping region formed within the first type well at a bottom of a region where bias contacts are expected to be formed. The stack type semiconductor device comprises the vias connected to the second type doping regions; the bias contacts connected to the first type doping region; contact pads electrically connected to the vias; and bias pads electrically connected to the bias contacts.

4 Claims, 2 Drawing Sheets

STACK TYPE SEMICONDUCTOR DEVICE

CROSS-REFERENCES TO RELATED APPLICATION

The present application claims priority under 35 U.S.C. §119(a) to Korean application number 10-2012-0040379, filed on Apr. 18, 2012, in the Korean Intellectual Property Office, which is incorporated herein by reference in its entirety.

BACKGROUND

1. Technical Field

The present invention relates to a semiconductor device, and more particularly, to a stack type semiconductor device and a method of fabricating and testing the same.

2. Related Art

In general, a stack type semiconductor device refers to a structure in which a plurality of dies in which semiconductor circuits is designed. The stack dies are electrically coupled through a Through Silicon Via (TSV).

The TSV fabrication methods may be classified into a via-first, a via-middle, and a via-last method based on when the TSV is fabricated. The via-last method may be subdivided into a via-front method and a via-backside method.

In the via-first, via-middle, and via-front methods, vias are formed in specific positions of a semiconductor substrate, and the vias are exposed on the back surface of the semiconductor substrate by a back-grinding process.

In this stack type semiconductor device, after fabricating the dies or after the dies are stacked, a test is performed to determine whether the vias are bad.

In particular, in order to perform the via test in semiconductor dies formed using the via-first, via-middle, or via-front method, back-grinding must be performed on the semiconductor dies so that vias are exposed on the back of the semiconductor substrate. Next, whether the vias are bad or not is checked by testing the back-grinded semiconductor dies one by one or by performing a test after stacking the semiconductor dies.

In order to perform a test on each of the semiconductor dies by screening after back-grinding, specific patterns are formed in the back of the semiconductor substrate, that is, a grinded face, and the vias are interconnected through specific patterns.

If specific patterns are formed in the back of the semiconductor substrate in order to perform a test, however, a crack may be generated in a wafer when the test is performed and there are difficulties in forming the patterns while avoiding a phenomenon in which the thinned wafer is rolled because the semiconductor substrate has become thin by back-grinding. Furthermore, there are problems in that an additional process of removing the patterns formed for the test is required after the test is completed and the wafer may be damaged in the process of removing the patterns. Moreover, a test in the vias coupled by the test patterns is possible, but a test in circuit patterns formed in a core region is not possible.

A Boundary Scan Test (BST) method may be used in order to perform a test after stacking individual dies. However, all dies including bad vias cannot be precisely screened by using the BST method. If packaging is performed in the state in which a die includes a bad via, the yield cannot be secured.

SUMMARY

In one embodiment of the present invention, a stack type semiconductor device includes a plurality of contact pads externally exposed; a via array electrically connected to the contact pads; a semiconductor substrate configured to have vias of the via array electrically conductive with each other or insulated from each other; and a bias pad configured to supply a bias to the semiconductor substrate, wherein the semiconductor substrate may be subject to back-grinding.

In another embodiment of the present invention, a stack type semiconductor device includes a first type well formed at a first height from the bottom of a semiconductor substrate; second type doping regions formed within the first type well at the bottoms of regions where vias are expected to be formed; a first type doping region formed within the first type well at the bottom of a region where bias contacts are expected to be formed; the vias connected to the second type doping regions; the bias contacts connected to the first type doping region; contact pads electrically connected to the vias; and bias pads electrically connected to the bias contacts, wherein the semiconductor substrate may be subject to back-grinding up to a position equal to or higher than the first height.

In yet another embodiment of the present invention, a method of fabricating each of the dies of a stack type semiconductor device includes forming a first type well having a first height on the lower side of a semiconductor substrate; forming one or more second type doping regions within the first type well at the bottoms of regions where vias are expected to be formed; forming a first type doping region within the first type well at the bottom of a region where a bias contact is expected to be formed; forming the vias to be electrically connected to the second type doping regions, respectively; forming the bias contact to be electrically connected to the first type doping region; forming contact pads electrically connected the respective vias; and forming a bias pad electrically connected to the bias contact.

In further yet another embodiment of the present invention, a method of performing a test in each die of a stack type semiconductor device including a plurality of externally exposed contact pads, a via array electrically connected to the contact pads, a semiconductor substrate configured to include the array of vias electrically conductive with each other or insulated from each other, and a bias pad configured to supply a bias to the semiconductor substrate includes supplying a positive voltage to the bias pad and measuring current flowing through each of the contact pads.

BRIEF DESCRIPTION OF THE DRAWINGS

Features, aspects, and embodiments are described in conjunction with the attached drawings, in which.

DETAILED DESCRIPTION

Hereinafter, a stack type semiconductor device and a method of fabricating and testing the same according to embodiments of the present invention will be described below with reference to the accompanying drawings through example embodiments.

Figure 1:
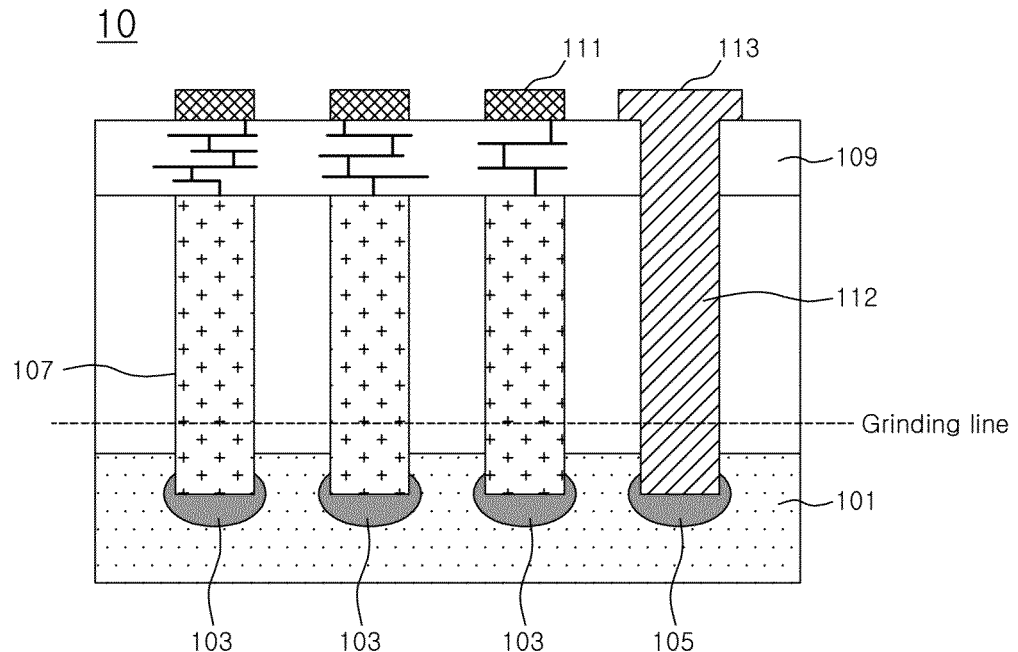
FIG. 1 is a diagram showing each of the dies of a stack type semiconductor device according to one embodiment of the present invention.

FIG. 1 is a diagram showing each of the dies of a stack type semiconductor device according to one embodiment of the present invention. It is to be noted that a core region where memory cells or logic cells are disposed is not shown. For reasons of simplicity, only a peripheral region where a via array is formed is shown.

Referring to FIG. 1, each die 10 of the stack type semiconductor device according to an embodiment of the present invention includes a first type well 101, first type doping regions 105, second type doping regions 103, vias 107, contact pads 111, a bias contact 112, and a bias pad 113. The first type well 101 may be formed at a specific height from the bottom of a semiconductor substrate (not shown). The second type doping regions 103 may be each formed at the bottom of a region where a via will be formed (hereinafter simply referred to as an 'expected via formation region') within the first type well 101. The first type doping region 105 may be formed at the bottom of a region where a bias contact will be formed (hereinafter simply referred to as an 'expected bias contact formation region') within the first type well 101. The vias 107 may be electrically connected to the second type doping regions 103, respectively. The contact pads 111 may be configured to electrically come in contact with the respective vias 107 and may be exposed outside the die 10. The bias contact 112 may be formed to be electrically connected to the first type doping region 105. The bias pad 113 may be configured to come in contact with the bias contact 112 and may be exposed outside the die 10.

After forming the vias 107, the contact pads 111, the bias contact 112, and the bias pad 113 as described above, a via test or a core test is performed by supplying a specific voltage to the bias pad 113.

If the via test or core test does not indicate a failure; the back of the semiconductor substrate is removed up to a grinding line defined by a boundary interface. That is, the first type well 101, the second type doping regions 103, and the first type doping region 105 are removed by a back-grinding process so that the vias 107 are exposed at the back of the semiconductor substrate. Accordingly, the fabrication of the die is completed.

To this end, the first type well 101 has to be formed to have a height taking into consideration a depth of back-grinded that may occur.

In the present invention, the first type well 101 is formed under an array of the vias 107. The second type doping regions 103 to which the respective vias 107 are connected and the first type doping region 105 to which the bias contact 112 is connected are formed within the first type well 101. Here, the first type can be a P type and the second type can be an N type, but these types are not limited thereto.

Accordingly, the first type well 101 and the second type doping regions 103 form a PN junction, and a test can be performed to determine whether the vias 107 are bad and/or defective.

In the present invention, each of the first type and the second type can be any type as long as the first type well 101 and the second type doping regions 103 are electrically conductive with each other or insulated from each other according to the level of voltage supplied to the bias pad 113. Furthermore, the first type well 101 and the first type doping region 105 can be formed by implanting ions having the same type.

Furthermore, the via test or the core test can be selectively performed by supplying a forward bias or a backward bias to the bias pad 113.

According to another embodiment of the present invention, the vias 107 formed in the die 10 can be connected to the contact pads 111 through a wire layer 109. The wire layer 109 is used to electrically couple the vias 107 with the respective contact pads 111, in particular, when the vias 107 are formed using the via-first method or the via-middle method.

In a structure in which the vias 107 directly come in contact with the contact pads 111, the wire layer 109 may be omitted.

Figure 2:
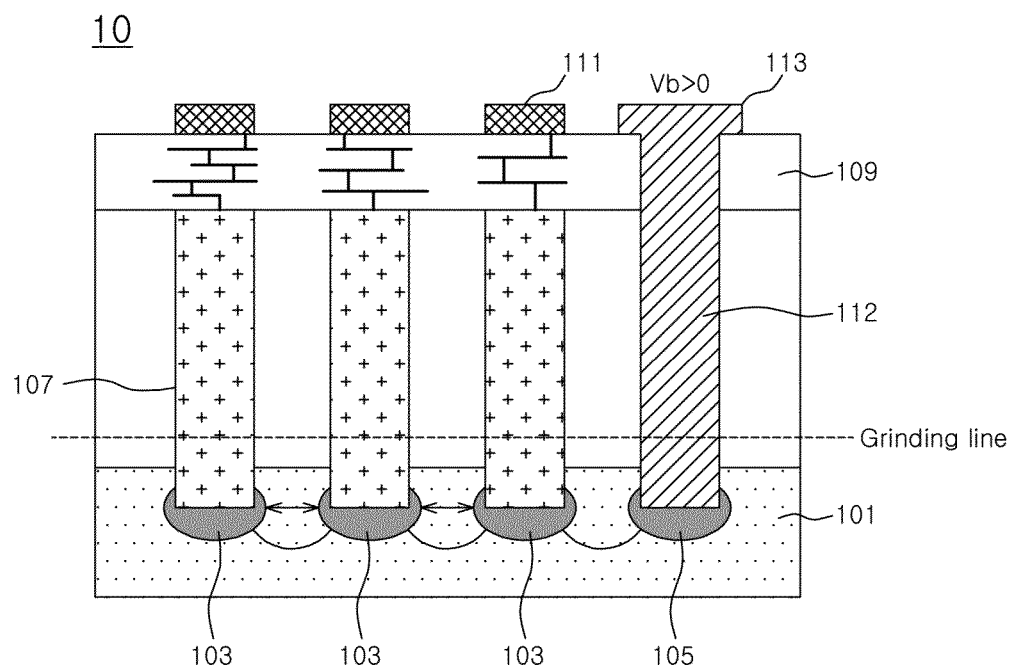
FIG. 2 is a diagram used in illustrating a via test method according to one embodiment of the present invention.

FIG. 2 is a diagram used in illustrating a via test method according to one embodiment of the present invention.

Referring to FIG. 2, a positive test voltage Vb (Vb>0), for example, a power source voltage VDD is supplied to the bias pad 113. Therefore, a forward bias path is formed in the first type well 101 and the second type doping regions 103. Thus, the semiconductor substrate may be configured such that the vias 107 of the array of vias 107 may be electrically conductive with each other when a positive test voltage Vb is supplied to the bias pad 113.

In this state, it can be checked whether a bad via exists by measuring current flowing through each of the contact pads 111 connected to the respective vias 107.

Figure 3:
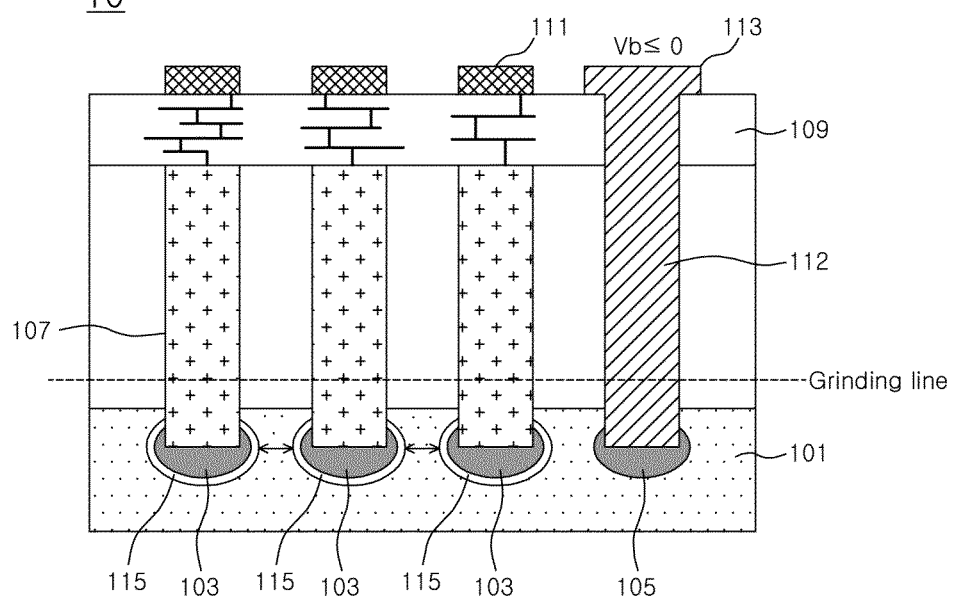
FIG. 3 is a diagram used in illustrating a core test method according to one embodiment of the present invention.

FIG. 3 is a diagram used in illustrating a core test method according to one embodiment of the present invention.

In order to perform a core-side test, a test voltage Vb of 0 or lower (Vb≤0) is supplied to the bias pad 113 as shown in FIG. 3. The core-side test may be performed after measuring the current flow through each of the contact pads 111 to the respective vias 107.

When the test voltage Vb of 0 or lower is supplied to the bias pad 113, the vias 107 are insulated from each other because a depletion region 115 is formed between the first type well 101 and each of the second type doping regions 103, so that electrical interference is not generated between the vias 107. Accordingly, the core-side test can be performed without interference due to the vias 107.

As described above, in the present invention, whether a via is bad can be screened at a wafer level without performing back-grinding. Furthermore, a core test can be performed in the state in which electrical interference with a core region due to electrical interference generated by the vias has been excluded.

Only dies determined to be good are stacked and packaged because the test is performed on each of the dies at a wafer level before staking and packaging. Accordingly, the yield and reliability are secured.

Figure 4:
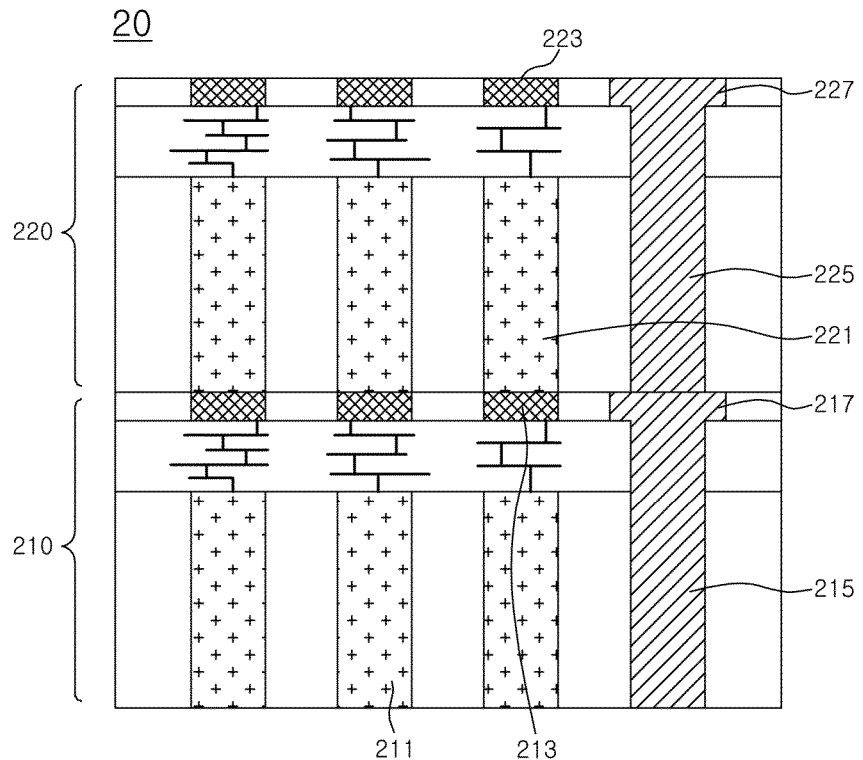
FIG. 4 shows the structure of a stack type semiconductor device according to one embodiment of the present invention.

FIG. 4 shows the structure of a stack type semiconductor device according to one embodiment of the present invention.

A semiconductor device 20 in which, for example, two dies 210 and 220 are stacked is illustrated in FIG. 4.

The dies 210 and 220 include respective vias 211 and 221, contact pads 213 and 223 electrically connected to the respective vias 211 and 221. The dies 210 and 220 may also include respective bias contacts 215 and 225, and bias pads 217 and 227 electrically connected to the respective bias contacts 215 and 225.

Furthermore, the dies 210 and 220 are fabricated according to the method described with reference to FIG. 1.

More particularly, a first type well is formed at a specific height from the bottom of a semiconductor substrate (not shown), second type doping regions are formed at the bottoms of expected via formation regions within the first type well, and a first type doping region at the bottom of an expected bias contact formation region. Next, the vias 211 and 221 are formed. The vias 211 and 221 may be connected to the second type doping regions and the bias contacts 215 and 225 connected to the first type doping region. Next, the contact pads 213 and 223 may be formed. The contact pads 213 and 223 may be connected to the vias 211 and 221 and the bias pads 217 and 227 connected to the bias contacts 215 and 225.

Before back-grinding is performed, a test voltage is supplied to the bias pads 217 and 227 formed in the respective dies 210 and 220. If the test voltage is a positive voltage, a forward bias path is formed between the first type well and the second type doping regions, and whether the vias 211 and 221 are bad is screened through the contact pads 213 and 223. Furthermore, if the test voltage is 0 or lower, a core test can be performed because the vias do not electrically interfere with circuit patterns formed in a core region.

After the test is completed, back-grinding is performed so that the vias 211 and 213 are exposed. Here, the first type well, the second type doping regions, and the first type doping region are removed. A test is performed to determine whether each die is good. Dies determined to be good are stacked as shown in FIG. 4 and are then packaged.

A stack type semiconductor device can have a type that supports via repair and a type that does not support via repair. In case of a stack type semiconductor device not supporting via repair, if any one of dies includes a bad via as a result of a test in the dies after the dies are stacked, all the stacked dies must be discarded.

In contrast, the present invention can greatly improve the yield because whether vias of each die are screened before packaging, and only dies determined to be good are selected and packaged.

Moreover, there are advantages in that there is no influence from a defect in a semiconductor substrate that is generated during a test because a via test can be performed before the semiconductor substrate is subject to back-grinding and both the via test and the core test are possible depending on the level of voltage supplied to the bias pad.

While certain embodiments have been described above, it will be understood to those skilled in the art that the embodiments described are by way of example only. Accordingly, the device and method described herein should not be limited based on the described embodiments. Rather, the device and method described herein should only be limited in light of the claims that follow when taken in conjunction with the above description and accompanying drawings.

What is claimed is:

1. A stack type semiconductor device, comprising:
    a first type well formed at a first height from a bottom of a semiconductor substrate;
    second type doping regions formed within the first type well at bottoms of regions where vias are expected to be formed;
    a first type doping region formed within the first type well at a bottom of a region where bias contacts are expected to be formed;
    the vias connected to the second type doping regions;
    the bias contacts connected to the first type doping region;
    contact pads electrically connected to the vias; and
    bias pads electrically connected to the bias contacts.

2. The stack type semiconductor device according to claim 1, further comprising wire layers configured to electrically couple the vias and the contact pads.

3. The stack type semiconductor device according to claim 1, wherein a positive voltage or a negative voltage is supplied to each of the bias pads in response to a test command.

4. The stack type semiconductor device according to claim 1, wherein:
    the stack type semiconductor device comprises one or more vias, and
    the second type doping regions are formed to correspond to the respective vias.

* * * * *